(12) United States Patent
Lin et al.

(10) Patent No.: US 8,623,468 B2
(45) Date of Patent: Jan. 7, 2014

(54) METHODS OF FABRICATING METAL HARD MASKS

(75) Inventors: Su-Horng Lin, Hsinchu (TW); Lin-Jung Wu, Miaoli (TW); Chi-Ming Yang, Hsian-San District (TW); Chin-Hsiang Lin, Hsin-chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 8 days.

(21) Appl. No.: 13/343,857

(22) Filed: Jan. 5, 2012

(65) Prior Publication Data

US 2013/0174982 A1 Jul. 11, 2013

(51) Int. Cl.
*H05H 1/24* (2006.01)

(52) U.S. Cl.
USPC ............ 427/533; 427/535; 427/569; 427/576

(58) Field of Classification Search
USPC ........... 427/255.391, 255.394, 569, 576, 533, 427/535
See application file for complete search history.

(56) References Cited

U.S. PATENT DOCUMENTS

| | | | | |
|---|---|---|---|---|
| 6,884,476 | B2* | 4/2005 | Pfaendtner et al. | 427/596 |
| 7,452,811 | B2* | 11/2008 | Choi et al. | 438/681 |
| 2002/0001928 | A1* | 1/2002 | Wang et al. | 438/582 |
| 2002/0090450 | A1* | 7/2002 | Hartner et al. | 427/79 |
| 2002/0098281 | A1* | 7/2002 | Ning | 427/129 |
| 2003/0124842 | A1* | 7/2003 | Hytros et al. | 438/680 |
| 2007/0116888 | A1* | 5/2007 | Faguet | 427/569 |
| 2007/0231473 | A1* | 10/2007 | Suwa et al. | 427/130 |
| 2009/0286398 | A1* | 11/2009 | Uesugi | 438/686 |
| 2010/0102417 | A1* | 4/2010 | Ganguli et al. | 257/532 |

OTHER PUBLICATIONS

Posseme, N., et al., "Residue growth on metallic-hard mask after dielectric etching in fluorocarbon-based plasmas. I. Mechanisms". J. Vac. Sci. Technol. B 28(4), Jul./Aug. 2010, pp. 809-816.*

Kushubiki, Masato, et al., "Fabrication of Contact/Via Holes for 32-nm Technology Device Using Cost-effective RIE CD Shrink Process and Double Pattterning Technique". Proc. of SPIE vol. 6924 692426, pp. 1-9.*

* cited by examiner

*Primary Examiner* — Bret Chen
(74) *Attorney, Agent, or Firm* — Haynes and Boone, LLP

(57) ABSTRACT

Methods of fabricating a metal hard mask and a metal hard mask fabricated by such methods are described. The method includes flowing at least one metal reactant gas into a reaction chamber configured to perform chemical vapor deposition (CVD), wherein the at least one metal reactant gas includes a metal-halogen gas or a metal-organic gas. The method further includes depositing a hard mask metal layer by CVD using the at least one metal reactant gas.

18 Claims, 6 Drawing Sheets

CVD with cyclic plasma treatment

CVD without cyclic plasma treatment

PVD

METHODS OF FABRICATING METAL HARD MASKS

BACKGROUND

Hard masks are used in semiconductor processing to transfer patterns onto substrates, in particular as feature sizes are increasingly shrinking. A metal hard mask can provide a desired etching profile and critical dimension control for decreasing geometries. However, pattern distortion can result from hard masks fabricated with high residual stress, and a thermal budget may be required to release stress in the hard mask.

SUMMARY

The present disclosure provides for various advantageous embodiments. According to one embodiment, a method for fabricating a metal hard mask includes flowing at least one metal reactant gas into a reaction chamber configured to perform chemical vapor deposition (CVD), wherein the at least one metal reactant gas includes a metal-halogen gas or a metal-organic gas. The method further includes depositing a hard mask metal layer by CVD using the at least one metal reactant gas. According to one aspect, the method may further include tuning a stress and/or a density of the deposited hard mask metal layer with a plasma treatment on the deposited hard mask metal layer. The plasma treatment may include stopping flow of the at least one metal reactant gas and bombarding the deposited hard mask TiN layer with a plasma formed from the at least one carrier gas.

In another embodiment, a method for fabricating a metal hard mask includes flowing at least one metal reactant gas and at least one carrier gas into a reaction chamber configured to perform chemical vapor deposition (CVD), wherein the at least one metal reactant gas includes a titanium-halogen gas or a titanium-organic gas. The method further includes depositing a hard mask TiN layer by CVD using the at least one metal reactant gas and the at least one carrier gas. According to one aspect, the method may further include tuning a stress and/or a density of the deposited hard mask TiN layer with a plasma treatment on the deposited hard mask TiN layer, and performing multiple cycles of hard mask TiN layer CVD and plasma treatment to form a plurality of hard mask TiN layers, each hard mask TiN layer deposited one above the other.

In yet another embodiment, a metal hard mask comprises a titanium hard mask metal layer or a tantalum hard mask metal layer deposited by chemical vapor deposition (CVD) from at least one metal reactant gas including a metal-halogen gas or a metal-organic gas, wherein the titanium hard mask metal layer is deposited by plasma enhanced CVD (PECVD) or metal-organic CVD (MOCVD) using a titanium-halogen precursor or a titanium-organic precursor, and wherein the tantalum hard mask metal layer is deposited by PECVD or MOCVD using a tantalum-halogen precursor or a tantalum-organic precursor.

Advantageously, the present disclosure provides methods for fabricating a metal hard mask that is substantially stress-free or reduced in stress with a high density. The methods are simplified without requiring a conventional post-deposition anneal process, thus improving a thermal budget while maintaining device performance and ensuring high-k integrity.

BRIEF DESCRIPTION OF THE DRAWINGS

Aspects of the present disclosure are understood from the following detailed description when read with the accompanying figures. It is emphasized that, in accordance with the standard practice in the industry, various features may not be drawn to scale. In fact, the dimensions of the various features may be arbitrarily increased or reduced for clarity of discussion.

DETAILED DESCRIPTION

Figure 1:
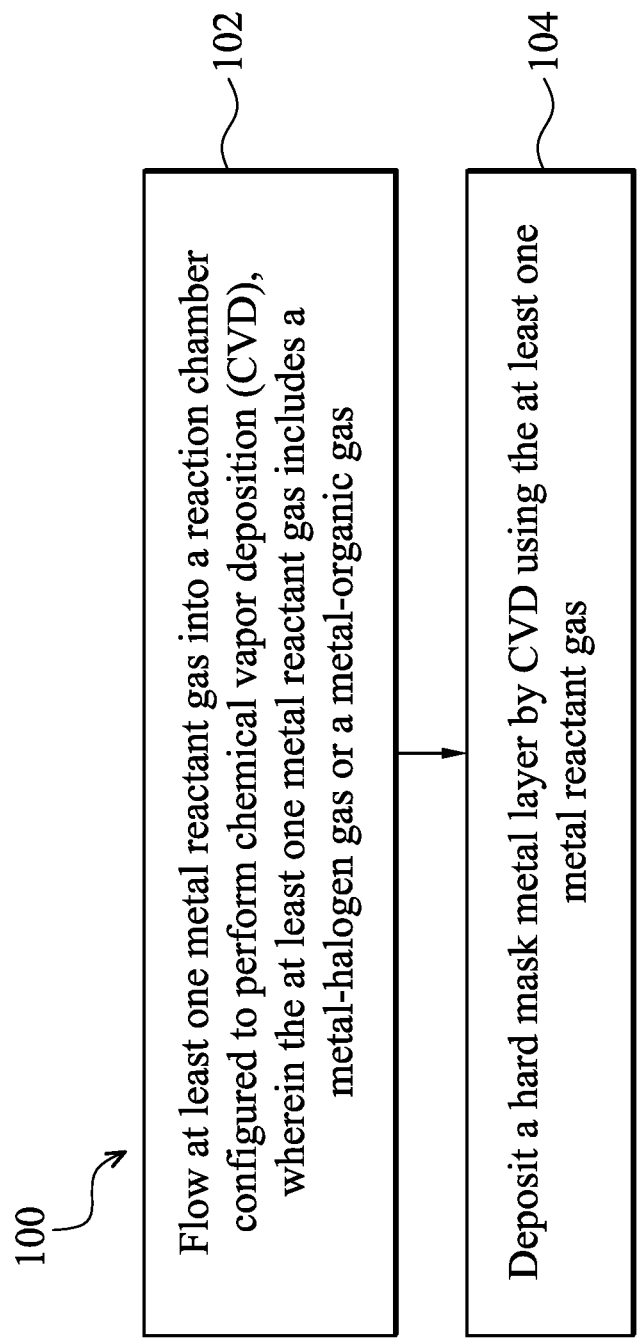
FIG. 1 is a flowchart illustrating a method for fabricating a metal hard mask in accordance with embodiments of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity. It is noted that the same or similar features may be similarly numbered herein for the sake of simplicity and clarity. In addition, some of the drawings may be simplified for clarity. Thus, the drawings may not depict all of the components of a given apparatus (e.g., device) or method.

Various aspects of the present disclosure will be described herein with reference to drawings that are schematic illustrations of idealized configurations of the present disclosure. As such, variations from the shapes of the illustrations as a result, for example, manufacturing techniques and/or tolerances, are to be expected. Thus, the various aspects of the present disclosure presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a", "an", and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

It will be understood that although the terms "first", "second", "third", and so on, may be used herein to describe various process parameters or elements, such as RF power, tap setting, precursor gases, electrodes, and the like, these process parameters or elements should not be limited by these terms. These terms are only used to distinguish one process parameter or element from another process parameter or element. Thus, a first RF power, gas, tap setting, or electrode discussed below could be termed a second RF power, gas, tap setting, or electrode without departing from the teachings of the present disclosure.

It is understood that several processing steps and/or features of a device may be only briefly described, such steps and/or features being well known to those of ordinary skill in the art. Also, additional processing steps or features can be added, and certain of the following processing steps or features can be removed and/or changed while still implementing the claims. Thus, the following description should be understood to represent examples only, and are not intended to suggest that one or more steps or features is required.

Figure 2:
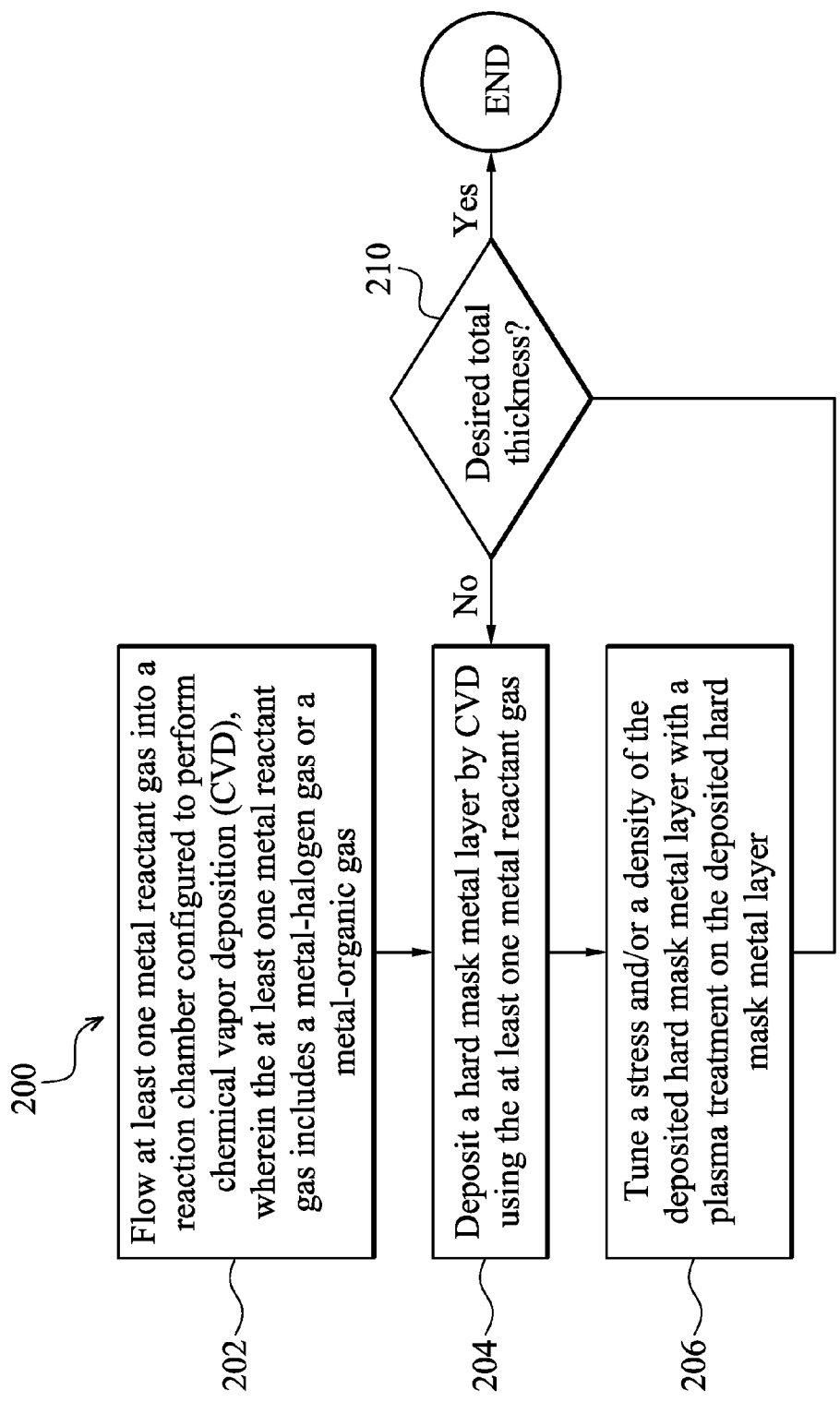
FIG. 2 is a flowchart illustrating another method for fabricating a metal hard mask in accordance with embodiments of the present disclosure.

Referring now to FIGS. 1 and 2, flowcharts are shown illustrating a method 100 and a method 200, respectively, for fabricating a metal hard mask in accordance with embodiments of the present disclosure.

Method 100 includes flowing at least one metal reactant gas into a reaction chamber configured to perform chemical vapor deposition (CVD) at block 102, wherein the at least one metal reactant gas includes a metal-halogen gas or a metal-organic gas. Method 100 further includes depositing a hard mask metal layer by CVD using the at least one metal reactant gas at block 104. According to one aspect, the method may further include tuning a stress and/or a density of the deposited hard mask metal layer with a plasma treatment on the deposited metal layer. The plasma treatment may include stopping flow of the at least one metal reactant gas and bombarding the deposited metal layer with a plasma formed from at least one carrier gas.

Method 200 includes flowing at least one metal reactant gas and at least one carrier gas into a reaction chamber configured to perform chemical vapor deposition (CVD) at block 202, wherein the at least one metal reactant gas includes a metal-halogen gas or a metal-organic gas. Method 200 further includes depositing a hard mask metal layer by CVD using the at least one metal reactant gas at bock 204, and tuning a stress and/or a density of the deposited hard mask metal layer with a plasma treatment on the deposited hard mask metal layer at block 206. The plasma treatment includes stopping flow of the at least one metal reactant gas and bombarding the deposited metal layer with a plasma formed from the at least one carrier gas. Method 200 further includes determining whether a desired total thickness of the metal layer or the metal hard mask has been reached at decision block 210. If the desired total thickness has not been reached ("no"), blocks 204 and 206 are repeated to perform multiple cycles of metal layer CVD and plasma treatment to form a plurality of metal layers, with each metal layer deposited one above the other. If the desired total thickness has been reached ("yes"), then method 200 ends.

The various steps in methods 100 and 200 described above may be performed by various techniques, means, apparatus, and/or systems. It should be noted that the operations of methods 100 or 200 may be rearranged or otherwise modified within the scope of the various aspects of the present disclosure. It is further noted that additional processes may be provided before, during, and after the operations of methods 100 or 200, and that some other processes may only be briefly described herein. Thus, other implementations are possible within the scope of the various aspects described herein.

According to one embodiment of the present disclosure, the reaction chamber may include a first electrode configured to support a substrate (e.g., a dielectric) and a second electrode disposed above the first electrode and the substrate. A radio frequency (RF) power may be applied between the first and second electrodes to deposit the metal layer onto the substrate. Another RF power may be applied between the first and second electrodes during a termination operation, and in one example, a second RF power may be less than a first RF power. In other words, a deposition operation may occur with the flowing of at least one reactant gas and a carrier or dilution gas into the deposition chamber and application of a first (main deposition) power level to the electrodes of the reaction chamber. A second power may be applied between electrodes of the reaction chamber during a termination operation or plasma treatment operation that subsequently occurs after the deposition operation.

According to an aspect of the present disclosure, the deposited hard mask metal layer may include a titanium layer, a titanium nitride layer, a tantalum layer, or a tantalum nitride layer. According to another aspect, the hard mask metal layer may be deposited by plasma enhanced CVD (PECVD) or metal-organic CVD (MOCVD).

According to yet another aspect of the present disclosure, the at least one metal reactant gas is selected from the group consisting of a titanium-halogen gas (e.g., $TiCl_4$), a titanium-organic gas (e.g., tetrakis-(dimethylamido)titanium (TDMAT), tetrakis-(diethylamido)titanium (TDEAT)), a tantalum-halogen gas, a tantalum-organic gas, and combinations thereof. According to another aspect of the present disclosure, methods 100 and 200 may each further comprise flowing a second reactant gas into the reaction chamber, wherein the second reactant gas is selected from the group consisting of nitrogen, ammonia, and combinations thereof. According to yet another aspect of the present disclosure, the carrier gas is selected from the group consisting of helium, argon, hydrogen, and combinations thereof. In one example, to form a TiN film, Ti-containing gases and N-containing gases are used as precursor gases, an inert gas is used as a carrier gas, and power applied between the electrodes during the deposition operation ranges between about 0 Watts and about 200 Watts, for between about 0 seconds and about 20 seconds. Process temperature may range between about 350 degrees Celsius and about 450 degrees Celsius, and process pressure may range between about 1 Torr and about 50 Torr.

In one embodiment of a PECVD process, a glow discharge (i.e., a plasma) is formed when RF power is applied between the two electrodes in the reaction chamber. Reactant gases contained within the reaction chamber produce chemically reactive species (e.g., atoms, ions, and radicals). These reactive species diffuse to and are absorbed on the surface of the substrate material. RF power may be applied to both the upper and lower electrodes. According to yet another aspect of the present disclosure, RF power may be applied to the upper electrode and the lower electrode may be held at ground potential. An impedance matching unit may be adjusted to maximize the amount of RF power absorbed by the plasma. The setting of the impedance matching unit is called a tap setting in this document and corresponds to a maximum RF power applied between the upper and lower electrodes and absorbed by the plasma.

According to an aspect of the present disclosure, the plasma treatment may include stopping flow of the at least one metal reactant gas into the reaction chamber and bombarding the deposited hard mask metal layer with plasma formed from nitrogen, ammonia, argon, helium, hydrogen, or a combination thereof, to thereby tune the stress and/or density of the deposited metal layer. The density of the deposited film may be increased by the plasma treatment, and in some instances for the case of Cl-containing precursor gases, the plasma treatment may remove Cl content. In one example, power applied between the electrodes during the plasma treatment operation may range between about 0 Watts and about 200 Watts, for between about 0 seconds and about 20 seconds. Process temperature may range between about 350 degrees Celsius and about 450 degrees Celsius, and process pressure may range between about 1 Torr and about 50 Torr.

According to one example, with no intent of limitation, the stress of the deposited hard mask metal layer is tuned to be between about 1E9 dyne/cm$^2$ and about −1E9 dyne/cm$^2$ and the density of the metal layer is tuned to be greater than about 4 g/cm$^3$. In yet another example, the density of the hard mask metal layer may be tuned to be greater than about 4.5 g/cm$^3$. In yet another example, the density of the hard mask metal layer may be tuned to be about 4.8 gm/cm$^3$.

According to an aspect of the present disclosure, method 100 may further comprise performing multiple cycles of hard mask metal layer CVD and plasma treatment to form a plurality of hard mask metal layers, with each hard mask metal layer deposited one above the other. For the case of a plurality of cycles of deposition and plasma treatment to form a plurality of hard mask metal layers in either method 100 or 200, different deposition and plasma treatment parameters in each or some cycles, in one example, or fixed deposition and plasma treatment parameters in each cycle, in another example, may be utilized. Total thickness of the metal hard mask may vary and deposition and plasma treatment cycles (i.e., one cycle includes a deposition operation and a plasma treatment operation) may range between about 3 cycles and about 20 cycles in one example.

According to yet another aspect of the present disclosure, a RF power applied between the first and second electrodes may be changed. The RF power may be changed by various processes, such as by stopping flow of at least one reactant gas into the reaction chamber, stopping flow of at least one carrier gas into the reaction chamber, changing a chamber pressure, applying a different power to the first electrode and/or the second electrode, changing a tap setting to an impedance matching unit coupled to the second electrode, and combinations thereof.

In one example, the RF power may be passively changed by stopping flow of at least one reactant gas into the reaction chamber, stopping flow of at least one carrier gas into the reaction chamber, changing a chamber pressure, or combinations thereof. In another example, the RF power may be actively changed by applying a different power to the first electrode and/or the second electrode, changing a tap setting to an impedance matching unit coupled to the second electrode, or combinations thereof. In yet another example, during the deposition operation, a first chamber pressure, a first chamber temperature, and a first maximum applied RF power may be provided between the electrodes of the reaction chamber. During a termination operation or a plasma treatment operation, a second chamber pressure, a second chamber temperature, and a second maximum applied RF power may be provided.

According to yet another aspect of the present disclosure, plasma may be formed by applying low frequency RF (LFRF) power to the first electrode, applying high frequency RF (HFRF) power to the second electrode, and forming a plasma between the first and second electrodes.

According to yet another aspect of the present disclosure, prior to applying a RF power between the first and second electrodes, a chamber pressure may be provided between about 1 Torr and about 50 Torr during a main deposition operation, a termination operation, or a plasma treatment operation, and a chamber temperature may be provided between about 350 degrees Celsius and about 450 degrees Celsius during a main deposition operation, a termination operation, or a plasma treatment operation.

Advantageously, the present disclosure provides methods for fabricating a metal hard mask that is substantially stress-free or reduced in stress with a high density, such as greater than about 4 g/cm$^3$. The methods are simplified without requiring a conventional post-deposition anneal process, thus improving a thermal budget while maintaining device performance and ensuring high-k integrity.

Figure 3C:
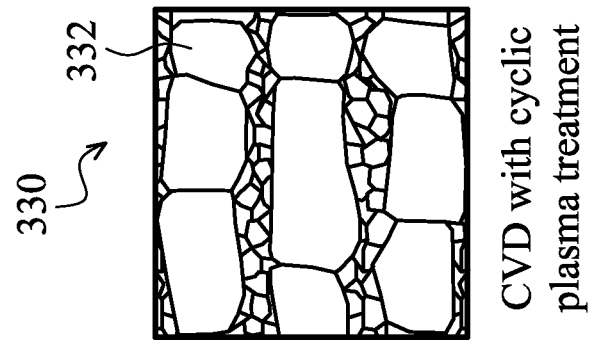
FIGS. 3A, 3B, and 3C illustrate example grain structures of layers formed by physical vapor deposition (PVD), chemical vapor deposition (CVD) without cyclic plasma treatment, and CVD with cyclic plasma treatment, respectively.
Figure 3B:
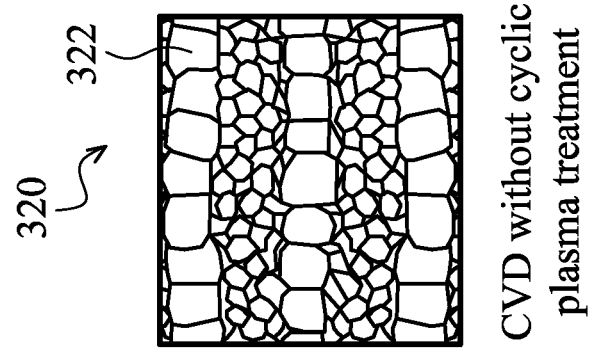
Figure 3A:
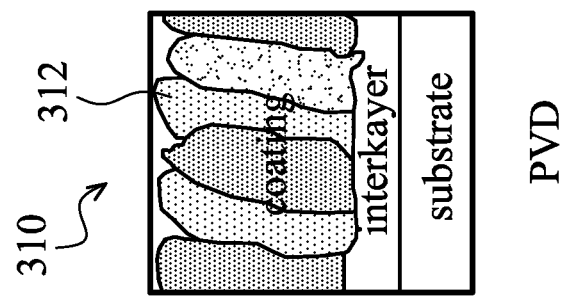

Referring now to FIGS. 3A, 3B, and 3C, example grain structures are illustrated of layers 310, 320, and 330 formed by physical vapor deposition (PVD), chemical vapor deposition (CVD) without cyclic plasma treatment, and CVD with cyclic plasma treatment, respectively.

FIG. 3A illustrates a TiN layer 310 with columnar grains 312 deposited by PVD, with a high hydrostatic strain field in the matrix. Disadvantageously, PVD processing requires high power and causes displacement, and the columnar grains cannot release strain/stress effectively. FIG. 3B illustrates a TiN layer 320 with equiaxed grains 322 deposited by CVD. Advantageously, CVD processing provides equiaxed grains which can release strain/stress effectively. FIG. 3C illustrates a TiN layer 330 with equiaxed grains 332 deposited by CVD and with cyclic plasma treatment. Advantageously, the equiaxed grains 332 formed from cyclic deposition and plasma treatment are larger sized than equiaxed grains 322 formed without plasma treatment, thus providing for layers that are substantially stress-free or reduced in stress but with a high density.

Figure 4B:
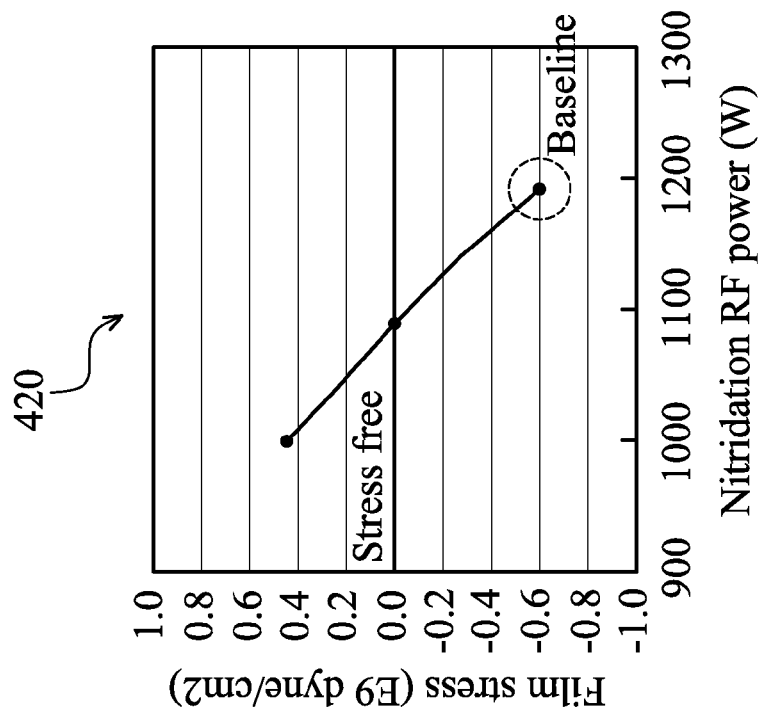
FIGS. 4A and 4B are graphs of example film stress versus plasma treatment time and plasma power, respectively.
Figure 4A:
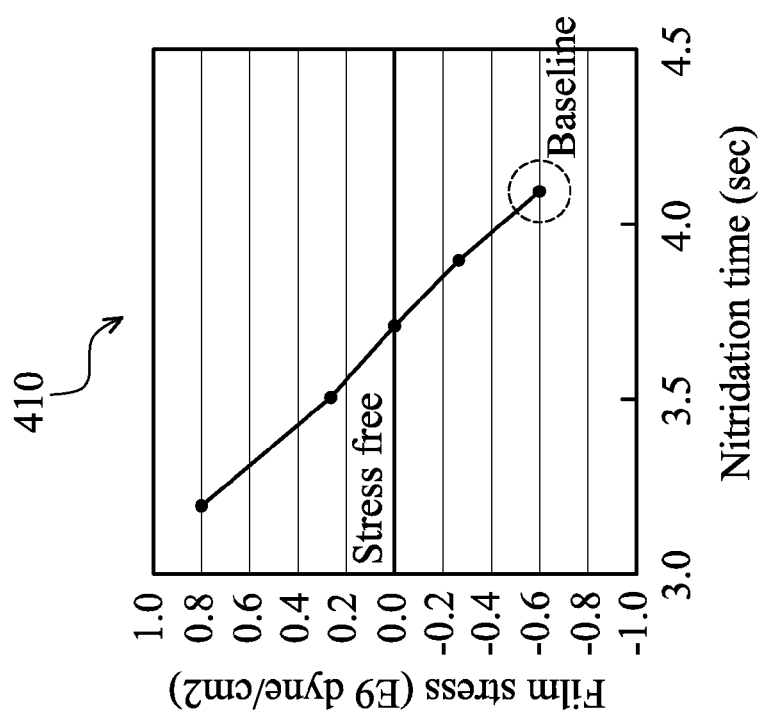

Referring now to FIGS. 4A and 4B, graphs 410 and 420 are shown of example film stress versus plasma treatment time and plasma power, respectively, in accordance with an example embodiment of the present disclosure. Graph 410 shows nitridation (i.e., plasma treatment with nitrogen) time in seconds on the x-axis, and film stress in dyne/cm$^2$ on the y-axis. Film stress is shown between about 1E9 dyne/cm$^2$ and about −1E9 dyne/cm² in one example, and between about 0.8 E9 dyne/cm² and about −0.8 E9 dyne/cm² in another example, with film stress moving from positive to negative with increasing nitridation time. Graph 420 shows nitridation RF power in watts on the x-axis, and film stress in dyne/cm² on the y-axis. Film stress is shown between about 1E9 dyne/cm² and about −1E9 dyne/cm² in one example, and between about 0.5 E9 dyne/cm² and about −0.6 E9 dyne/cm² in another example, with film stress moving from positive to negative with increasing nitridation RF power. Thus, film stress can be tuned to a level based on the plasma treatment time, the applied RF power, and/or the number of cycles of plasma treatment.

Figure 5:
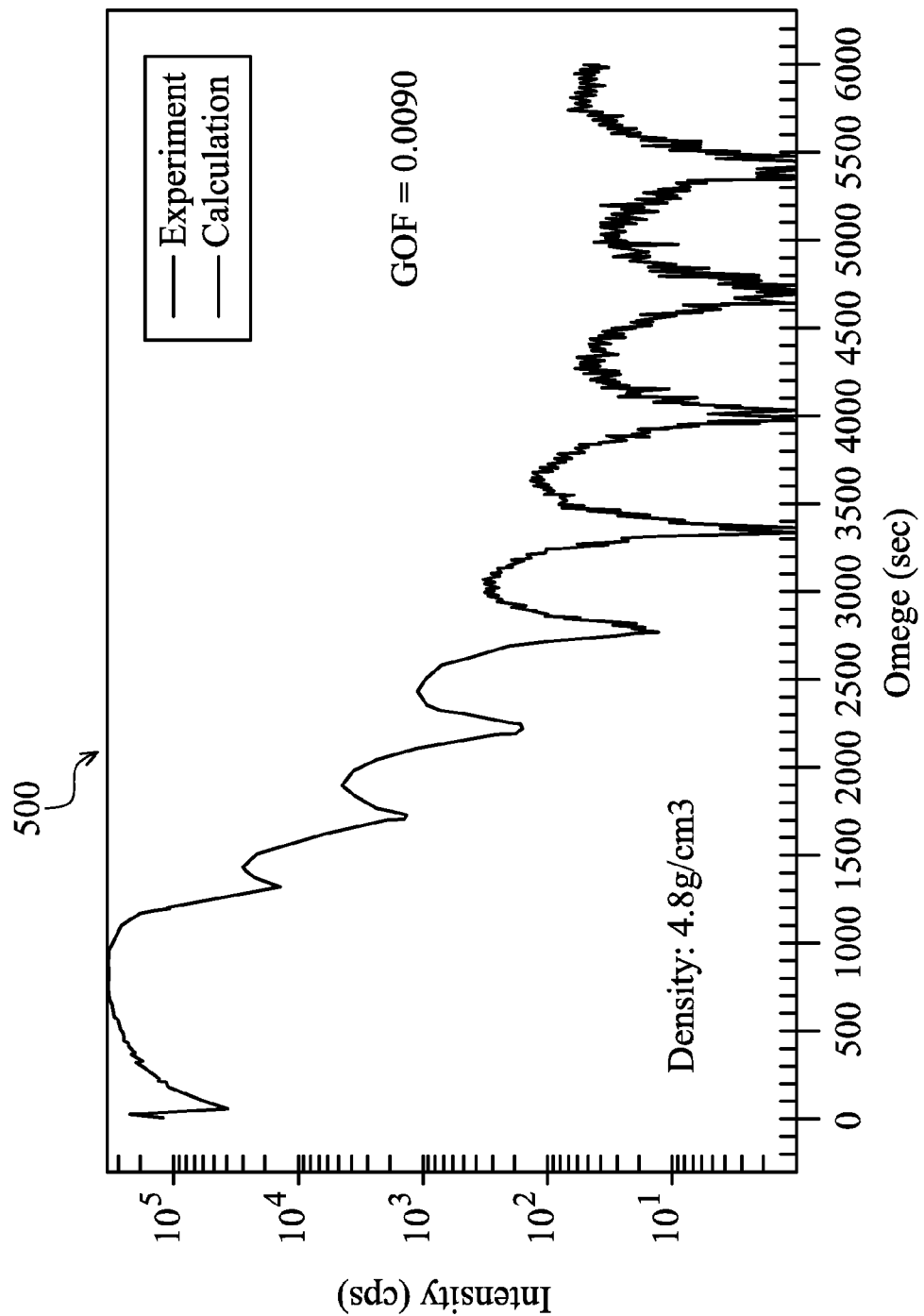
FIG. 5 is a graph of an example film density of a layer formed in accordance with embodiments of the present disclosure.

FIG. 5 is a graph 500 of an example film density of a layer formed in accordance with an example embodiment of the present disclosure. Film density of a TiN layer is shown greater than about 4 gm/cm³ in one example, and greater than about 4.8 g/cm³ in another example. Film density can be tuned to a level based on the plasma treatment time, the applied RF power, and/or the number of cycles of deposition and plasma treatment, which affects grain size and microstructure of the deposited layer.

Figure 6:
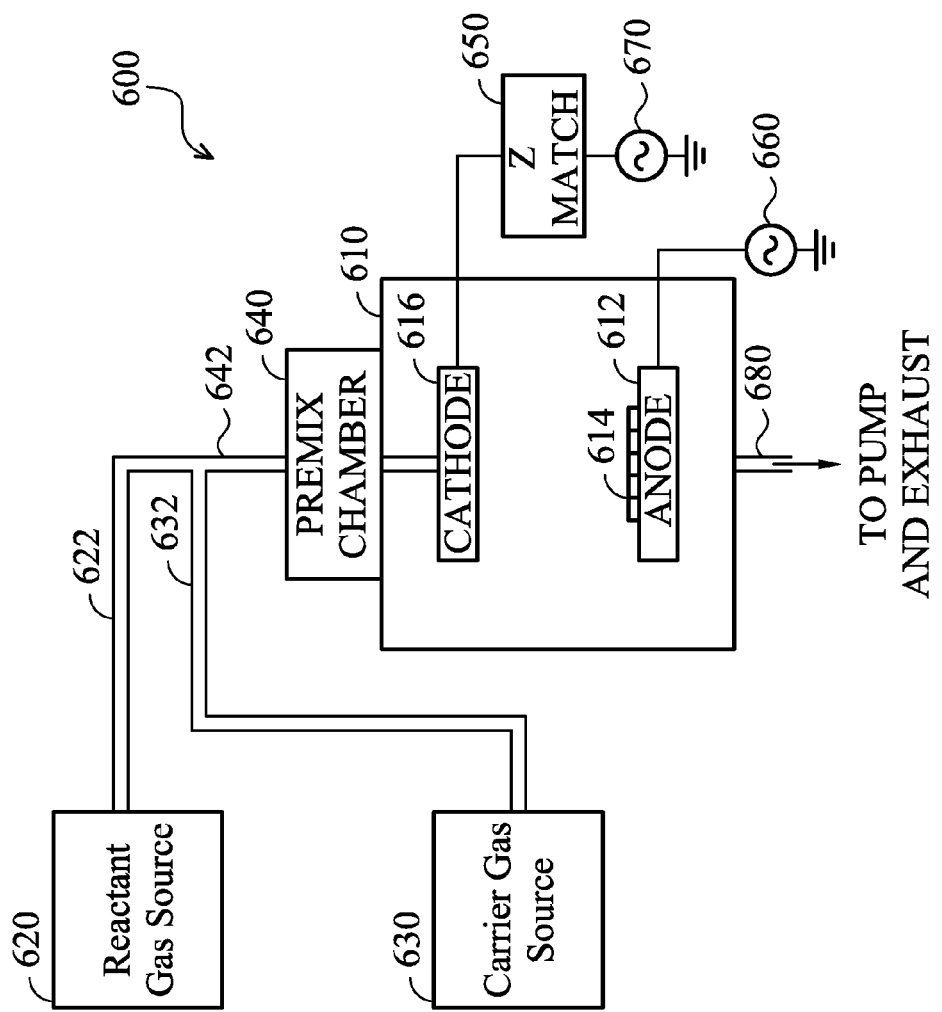
FIG. 6 illustrates a system for fabricating a metal hard mask in accordance with embodiments of the present disclosure.

Referring now to FIG. 6, a system 600 is illustrated for fabricating a metal hard mask in accordance with embodiments of the present disclosure. System 600 includes a reaction chamber 610 (e.g., a CVD chamber) including a first electrode 612 configured to support a substrate 614 and a second electrode 616 disposed above the first electrode 612 and the substrate 614. System 600 further includes at least one reactant gas source 620 and at least one carrier gas source 630, each operably coupled to reaction chamber 610 for flowing at least one reactant gas and at least one carrier gas, respectively, into the reaction chamber 610. System 600 further includes an impedance matching unit 650 coupled to the second electrode 616 to apply a radio frequency (RF) power between the first and second electrodes 612 and 616. A tap setting may be applied to impedance matching unit 650 to control the RF power applied between the first and second electrodes 612 and 616. During a deposition operation, a first tap setting may be applied to the impedance matching unit corresponding to a first maximum RF power, and during a termination operation or plasma treatment operation, a second tap setting may be applied to the impedance matching unit corresponding to a second maximum RF power. A first RF power or voltage source 660 is coupled to first electrode 612, and a second RF power or voltage source 670 is coupled to impedance matching unit 650. A pump and exhaust feed line 680 is connected to the chamber 610 to provide pumping to establish partial vacuum conditions therein during PECVD operation and to provide a gas exhaust line used to flush out the system after a wafer processing operation has been completed. In one example, process pressure for deposition and/or plasma treatment may be set between about 1 Torr and about 50 Torr. Chamber 610 may also include heating elements to control the temperature within the chamber as desired. In one example, process temperature for deposition and/or plasma treatment may range between about 350 degrees Celsius and about 450 degrees Celsius.

In one example, chamber 610 is a PECVD reaction chamber suitable to carry out the above described processes or methods 100 and/or 200. An example of a PECVD reaction chamber is available from the Novellus Corporation of San Jose, Calif. and sold under the trade name CONCEPT I. Other chambers may be used to carry out any of the methods described above.

In accordance with one aspect, first electrode 612 is opposed to second electrode 616 with a gap therebetween, and substrate 614 is disposed between the first and second electrodes 612 and 616. According to another aspect, first electrode 612 may function as an anode and be supplied with low frequency RF (LFRF) power from first RF power source 660, and second electrode 616 may function as a cathode and be supplied with high frequency RF (HFRF) power from second RF power source 670. In one embodiment, second electrode 616 may include a shower head electrode which is positioned operably adjacent the first electrode and configured to provide gaseous reactants into the chamber 610 from gas supply sources (e.g., reactant gas source 620, carrier gas source 630). In other embodiments, gaseous reactants may enter the chamber 610 through an inlet separate from the second electrode or through other means.

First electrode 612 is configured for supporting at least one substrate, e.g., in the form of a semiconductor wafer or dielectric substrate. The term "supporting" as used in this document and in connection with the first electrode is intended to mean holding or positioning one or more substrates in a desired orientation so that chemical vapor deposition can take place. Accordingly, substrate can be supported, held, or otherwise positioned in orientations other than the shown horizontal position. Furthermore, although a parallel plate PECVD chamber is illustrated, other RF power systems are applicable to perform the methods of the present disclosure, such as an inductive coil PECVD chamber as described in U.S. Pat. No. 6,705,246, the disclosure of which is incorporated by reference herein for all purposes. Furthermore, although chamber 610 is shown with two electrodes, it is to be understood that reaction chambers and methods can find use in systems which are not necessarily limited to only two electrodes. Furthermore, a single substrate is shown to be processed, but in other embodiments, a reaction chamber may be configured to process more than one substrate.

In accordance with one aspect, substrate 614 may include various semiconductor devices, and/or other suitable active and/or passive devices, at different stages of fabrication. Example semiconductor devices include integrated circuits including a metal-insulator-semiconductor field effect transistor (MOSFET) including complementary MOSFET (CMOS) features, CIS, and/or other suitable active and/or passive devices. In an embodiment, the substrate may include an integrated circuit (or portion thereof) designed and formed using a CMOS-based process. A substrate having a device (e.g., integrated circuit) formed by other semiconductor fabrication technologies is also within the scope of the described method.

In one embodiment, substrate 614 may include a semiconductor substrate, and may be comprised of silicon, or alternatively may include silicon germanium, gallium arsenic, or other suitable semiconductor materials. The semiconductor substrate may include underlying layers, devices, junctions, and other features (not shown) formed during prior process steps or which may be formed during subsequent process steps.

In accordance with one aspect, reactant gas source 620 and carrier gas source 630 may each include reservoirs and are coupled to a premix chamber 640 via feed lines 622, 632, and common gas feed line 642. At least one reactant gas and at least one carrier gas from reactant gas source 620 and dilution gas source 630, respectively, may be provided to premix chamber 640 for premixing into a substantially uniform gas mixture prior to flow into reaction chamber 610. In one example, premix chamber 640 is disposed directly adjacent to chamber 610.

Reactant gas source 620 may include a conventional bubbler chamber, a heater coil, a shut-off valve, and/or an output port. In one example, reactant gas source 620 may provide various reactant gases depending on the desired metal layer to be deposited, such as a titanium layer, a titanium nitride layer, a tantalum layer, or a tantalum nitride layer. In one example, reactant gases may include but are not limited to a titanium-halogen gas (e.g., $TiCl_4$), a titanium-organic gas (e.g., tetrakis-(dimethylamido)titanium (TDMAT), tetrakis-(diethylamido)titanium (TDEAT)), a tantalum-halogen gas, a tantalum-organic gas, and combinations thereof. In another example, nitrogen-containing gases, such as nitrogen or ammonia may be included as a reactant gas. Although a single reactant gas source 620 is illustrated, system 600 may include a plurality of reactant gas sources as desired and coupled in a similar manner as reactant gas source 620 to reaction chamber 610.

Carrier gas source 630 may include a heater coil, a shut-off valve, and/or an output port and may provide various carrier gases, including but not limited to helium, argon, and hydrogen.

Although not necessarily shown, reactant gas and carrier gas may be flowed from reactant gas source 620 and carrier/dilution gas source 630 to deposition chamber 610 through various apparatus such as flow lines, pressure regulators, valves, mass flow controllers or other flow controllers, manifolds, and/or regulators. In one example, mass flow controllers may be of the electronic type wherein a variable set point may be established to provide a constant chosen gas flow rate and to automatically compensate for external parameter variations, such as variations in temperature and variations in pressures in the various flow lines of the system. The manifolds may be used to provide premixing of the various combined gases.

Both of the feed lines 622 and 632 may be provided with shut-off valves which may be used at any time to both start up and shut down the system operation. Shut-off valves may also be included in reactant gas source 620 and/or carrier gas source 630.

System 600 may further include a purge gas source that is operably coupled to chamber 610 for flowing a purge gas into chamber 610 prior to deposition start up and may also be used to flush the system. The purge gas source may provide various purge gases, including but not limited to nitrogen or argon.

In one example operation, substrate 614 may be a silicon wafer or a dielectric substrate disposed on an upper surface of the anode electrode, and the silicon wafer may have been processed to various stages toward completion of the ultimate or complete integrated circuit being fabricated. For example, the wafer may have been processed to the stage where conductive interconnect strips have been disposed and interconnected on the wafer surface and are now ready to receive a protective dielectric coating of either silicon oxide or silicon nitride, or both, thereon.

In one embodiment, the power ratios received from the low frequency RF source 660 and the high frequency RF source 670 may be varied in order to vary the stress of the deposited dielectric layer from a highly tensile state to a highly compressive state. In one example, the high frequency RF source 670 may be operated at 13.56 megahertz and the low frequency RF source 660 may be operated between 10-400 kilohertz. As an example, the total RF power applied to the PECVD chamber may range between about 0 watts and about 200 watts. Although two RF power sources 660 and 670 are illustrated, a single RF power source may be used to apply RF power to each electrode 612 and 616 in another embodiment. An example of an RF power splitter and a single RF power source is illustrated and described in U.S. Pat. No. 6,705,246, the disclosure of which has been previously incorporated by reference herein.

The high frequency RF source 670 is connected as shown through an impedance matching unit 650 for impedance matching purposes, which may substantially prevent high frequency RF power from being reflected back into the RF source 670 and to maximize the amount of RF power absorbed by the plasma. Impedance matching unit 650 includes various capacitive and inductive components which are configured for impedance matching and for maximizing power applied between the first and second electrodes 612, 616 of reaction chamber 610.

Tap settings may be applied to the impedance matching unit coupled to the second electrode to apply a maximum radio frequency (RF) power between the first and second electrodes. Tap settings corresponding to applied maximum RF power may depend on various process parameters.

RF sources 660 and 670 are configured to provide RF power to the electrodes which is effective to both develop a plasma processing environment within the processing chamber and to provide a desired bias relative to the substrate. For example, a power differential between the electrodes may facilitate acceleration of ions or ionic species toward the subject substrate which may enhance conformal coverage and/or provide greater uniformity in film or layer composition.

It is also within the scope of the present disclosure and the claims appended hereto to deposit materials other than those specifically described above by modifying the reactant gas sources in a controlled manner by those skilled in the art. In addition, for at least some of the above described processes, it is possible to operate the reactant gas source and carrier gas source at room temperature and thereby eliminate the heating element as previously described. That is, the various vapor and gas delivery lines described above and located between the gas sources and the reaction chamber 610 may be relatively short, so that it is possible to obtain an adequate vapor flow rate in the delivery lines of this system at room temperature.

It is further possible to operate the reaction chamber 610 in all of the above examples within a wide temperature range of between about 300 degrees Celsius and about 500 degrees Celsius as a matter of choice and depending upon whether higher temperatures would unduly degrade a semiconductor structure being processed. In one example, process temperatures may range between about 350 degrees Celsius and about 450 degrees Celsius. Accordingly, these and other process and materials variations are clearly within the scope of the following appended claims.

Thus, the present disclosure provides for various embodiments. According to one embodiment, a method for fabricating a metal hard mask includes flowing at least one metal reactant gas into a reaction chamber configured to perform chemical vapor deposition (CVD), wherein the at least one metal reactant gas includes a metal-halogen gas or a metal-organic gas. The method further includes depositing a hard mask metal layer by CVD using the at least one metal reactant gas. According to one aspect, the method may further include tuning a stress and/or a density of the deposited hard mask metal layer with a plasma treatment on the deposited hard mask metal layer. The plasma treatment may include stopping flow of the at least one metal reactant gas and bombarding the deposited hard mask TiN layer with a plasma formed from the at least one carrier gas.

In another embodiment, a method for fabricating a metal hard mask includes flowing at least one metal reactant gas and at least one carrier gas into a reaction chamber configured to perform chemical vapor deposition (CVD), wherein the at least one metal reactant gas includes a titanium-halogen gas or a titanium-organic gas. The method further includes depositing a hard mask TiN layer by CVD using the at least one metal reactant gas and the at least one carrier gas. According to one aspect, the method may further include tuning a stress and/or a density of the deposited hard mask TiN layer with a plasma treatment on the deposited hard mask TiN layer, and performing multiple cycles of hard mask TiN layer CVD and plasma treatment to form a plurality of hard mask TiN layers, each hard mask TiN layer deposited one above the other.

In yet another embodiment, a metal hard mask comprises a titanium hard mask metal layer or a tantalum hard mask metal layer deposited by chemical vapor deposition (CVD) from at least one metal reactant gas including a metal-halogen gas or a metal-organic gas, wherein the titanium hard mask metal layer is deposited by plasma enhanced CVD (PECVD) or metal-organic CVD (MOCVD) using a titanium-halogen precursor or a titanium-organic precursor, and wherein the tantalum hard mask metal layer is deposited by PECVD or MOCVD using a tantalum-halogen precursor or a tantalum-organic precursor.

Advantageously, the present disclosure provides methods and systems for fabricating a metal hard mask, and a hard mask formed by such methods and systems, that is substantially stress-free or reduced in stress with a high density, such as greater than about 4 g/cm$^3$. The methods are simplified without requiring a conventional post-deposition anneal process, thus improving a thermal budget while maintaining device performance and ensuring high-k integrity. Accordingly, a hard mask may be fabricated without requiring a post-deposition anneal operation.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A method of fabricating a metal hard mask, the method comprising:
    flowing at least one metal reactant gas into a reaction chamber configured to perform chemical vapor deposition (CVD), wherein the at least one metal reactant gas is selected from the group consisting of a tantalum-halogen gas, a tantalum-organic gas, a titanium-halogen gas, and a titanium-organic gas;
    applying a first radio frequency (RF) power between a first electrode and a second electrode in the reaction chamber to deposit a hard mask metal layer by CVD using the at least one metal reactant gas;
    stopping flow of the at least one metal reactant gas into the reaction chamber;
    after stopping the flow of the at least one metal reactant gas, applying a second RF power, which is different than the first RF power, between the two electrodes in the reaction chamber to treat the hard mask metal layer with a plasma formed from a carrier gas.

2. The method of claim 1, wherein the depositing of the hard mask metal layer includes depositing a titanium layer, a titanium nitride layer, a tantalum layer, or a tantalum nitride layer by plasma enhanced CVD (PECVD) or metal-organic CVD (MOCVD).

3. The method of claim 1, wherein the plasma treatment tunes a stress and/or a density of the deposited hard mask metal layer.

4. The method of claim 3, wherein the stress of the hard mask metal layer is tuned to be between about 1E9 dyne/cm2 and about −1E9 dyne/cm2 and the density of the hard mask metal layer is tuned to be greater than about 4 g/cm3.

5. The method of claim 3, wherein the carrier gas comprises nitrogen, ammonia, argon, helium, hydrogen, or a combination thereof.

6. The method of claim 3, further comprising performing multiple cycles of hard mask metal layer CVD and plasma treatment to form a plurality of hard mask metal layers, each hard mask metal layer deposited one above the other.

7. The method of claim 1, further comprising flowing a second reactant gas into the reaction chamber, wherein the second reactant gas is selected from the group consisting of nitrogen and ammonia.

8. The method of claim 1, further comprising flowing the carrier gas into the reaction chamber, wherein the carrier gas is selected from the group consisting of helium, argon, and hydrogen.

9. The method of claim 1, wherein the first electrode functions as an anode and is supplied with low frequency RF from a first RF power source, and the second electrode functions as a cathode and is supplied with high frequency RF from a second RF power source.

10. The method of claim 9, wherein the first RF power source is operated between 10-400 kHz and the second RF power source is operated at 13.56 MHz.

11. A method of fabricating a titanium nitride (TiN) or tantalum nitride (TaN) hard mask, the method comprising:
    flowing at least one metal reactant gas and at least one carrier gas into a reaction chamber configured to perform chemical vapor deposition (CVD), wherein the at least one metal reactant gas includes a titanium-halogen gas, a titanium-organic gas, tantalum-halogen gas or a tantalum-organic gas;
    applying a radio frequency (RF) power between a first electrode and a second electrode in the reaction chamber to deposit a hard mask TiN or TaN layer by CVD using the at least one metal reactant gas and the at least one carrier gas;
    stopping flow of the at least one metal reactant gas into the reaction chamber;
    after stopping the flow of the at least one metal reactant gas, changing the RF power between the two electrodes in the reaction chamber to treat the hard mask TiN or TaN layer with a plasma formed from the at least one carrier gas.

12. The method of claim 11, wherein flowing the carrier gas into the reaction chamber includes flowing a carrier gas selected from the group consisting of helium, argon, and hydrogen.

13. The method of claim 11, wherein the depositing of the hard mask TiN or TaN layer includes depositing a titanium nitride or tantalum nitride layer by plasma enhanced CVD (PECVD) or metal-organic CVD (MOCVD).

14. The method of claim 11, further comprising:
    tuning a stress and/or a density of the deposited hard mask TiN or TaN layer with the plasma treatment on the deposited hard mask TiN or TaN layer; and
    performing multiple cycles of hard mask TiN or TaN layer CVD and plasma treatment to form a plurality of hard mask TiN or TaN layers, each hard mask TiN or TaN layer deposited one above the other.

15. The method of claim 14, wherein the stress of the hard mask TiN or TaN layer is tuned to be between about 1E9 dyne/cm$^2$ and about −1E9 dyne/cm$^2$ and the density of the hard mask TiN or TaN layer is tuned to be greater than about 4 g/cm$^3$.

16. The method of claim 14, wherein each cycle of plasma treatment includes bombarding the deposited hard mask TiN or TaN layer with plasma formed from nitrogen, ammonia, argon, helium, hydrogen, or a combination thereof, with RF power between about 0 Watts and about 200 Watts, for between about 0 seconds and about 20 seconds.

17. The method of claim 11, further comprising flowing a second reactant gas into the reaction chamber, wherein the second reactant gas is selected from the group consisting of nitrogen and ammonia.

18. The method of claim 11, wherein the first electrode functions as an anode and is supplied with low frequency RF from a first RF power source, and the second electrode functions as a cathode and is supplied with high frequency RF from a second RF power source.

\* \* \* \* \*